(12) United States Patent
Matsuura et al.

(10) Patent No.: US 11,692,269 B2
(45) Date of Patent: Jul. 4, 2023

(54) PLASMA PROCESSING APPARATUS

(71) Applicant: Tokyo Electron Limited, Tokyo (JP)

(72) Inventors: Hiroyuki Matsuura, Iwate (JP); Kiyotaka Ishibashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 273 days.

(21) Appl. No.: 16/883,598

(22) Filed: May 26, 2020

(65) Prior Publication Data

US 2020/0378005 A1    Dec. 3, 2020

(30) Foreign Application Priority Data

May 28, 2019 (JP) ................. 2019-099722
Apr. 3, 2020 (JP) ................. 2020-067737

(51) Int. Cl.

| C23C 16/00 | (2006.01) |
| C23C 16/50 | (2006.01) |
| H01J 37/32 | (2006.01) |
| H01L 21/673 | (2006.01) |
| C23C 16/458 | (2006.01) |
| C23C 16/34 | (2006.01) |
| C23C 16/44 | (2006.01) |
| H01L 21/02 | (2006.01) |

(52) U.S. Cl.
CPC ............ *C23C 16/50* (2013.01); *C23C 16/345* (2013.01); *C23C 16/4408* (2013.01); *C23C 16/4584* (2013.01); *H01J 37/32082* (2013.01); *H01J 37/32091* (2013.01); *H01J 37/32458* (2013.01); *H01J 37/32541* (2013.01); *H01J 37/32715* (2013.01); *H01L 21/67303* (2013.01); *H01J 2237/3321* (2013.01); *H01L 21/0217* (2013.01); *H01L 21/02274* (2013.01)

(58) Field of Classification Search
None
See application file for complete search history.

(56) References Cited

U.S. PATENT DOCUMENTS

| 7,094,708 B2* | 8/2006 | Kato ................. C23C 16/45542 438/778 |
| 7,351,668 B2* | 4/2008 | Chou ................ C23C 16/45578 438/758 |
| 2008/0153308 A1* | 6/2008 | Ogawa ............. C23C 16/45542 438/758 |
| 2009/0255468 A1* | 10/2009 | Yamamoto .......... H01L 21/3185 118/723 E |

(Continued)

FOREIGN PATENT DOCUMENTS

JP    2007-258580 A    10/2007

*Primary Examiner* — Sylvia MacArthur
*Assistant Examiner* — Michelle Crowell
(74) *Attorney, Agent, or Firm* — Venjuris, P.C.

(57) ABSTRACT

A plasma processing apparatus includes: a processing container having a cylindrical shape; a pair of plasma electrodes arranged along the longitudinal direction of the processing container while facing each other; and a radio-frequency power supply configured to supply a radio-frequency power to the pair of plasma electrodes. In the pair of plasma electrodes, an inter-electrode distance at a position distant from a power feed position to which the radio-frequency power is supplied is longer than an inter-electrode distance at the power feed position.

9 Claims, 13 Drawing Sheets

(56) References Cited

U.S. PATENT DOCUMENTS

| | | | |
|---|---|---|---|
| 2012/0100722 A1* | 4/2012 | Asai | H01L 21/0217 |
| | | | 438/758 |
| 2012/0225218 A1* | 9/2012 | Savas | H01J 37/32036 |
| | | | 427/576 |
| 2015/0107517 A1* | 4/2015 | Hasebe | C23C 16/452 |
| | | | 118/723 R |
| 2016/0265107 A1* | 9/2016 | Oikawa | H01L 21/67309 |

* cited by examiner

PLASMA PROCESSING APPARATUS

CROSS-REFERENCE TO RELATED APPLICATIONS

This application is based on and claims priority from Japanese Patent Application Nos. 2019-099722 and 2020-067737, filed on May 28, 2019 and Apr. 3, 2020, respectively, with the Japan Patent Office, the disclosures of which are incorporated herein in their entireties by reference.

TECHNICAL FIELD

The present disclosure relates to a plasma processing apparatus.

BACKGROUND

A plasma processing apparatus is known in which a plurality of substrates is accommodated substantially horizontally at intervals in the vertical direction in a processing container in order to perform a plasma processing collectively on the plurality of substrates (see, e.g., Japanese Patent Laid-Open Publication No. 2007-258580).

SUMMARY

According to an aspect of the present disclosure, a plasma processing apparatus includes: a processing container having a cylindrical shape; a pair of plasma electrodes arranged along the longitudinal direction of the processing container while facing each other; and a radio-frequency power supply configured to supply a radio-frequency power to the pair of plasma electrodes. In the plasma electrodes, an inter-electrode distance at a position distant from a power feed position to which the radio-frequency power is supplied is longer than an inter-electrode distance at the power feed position.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
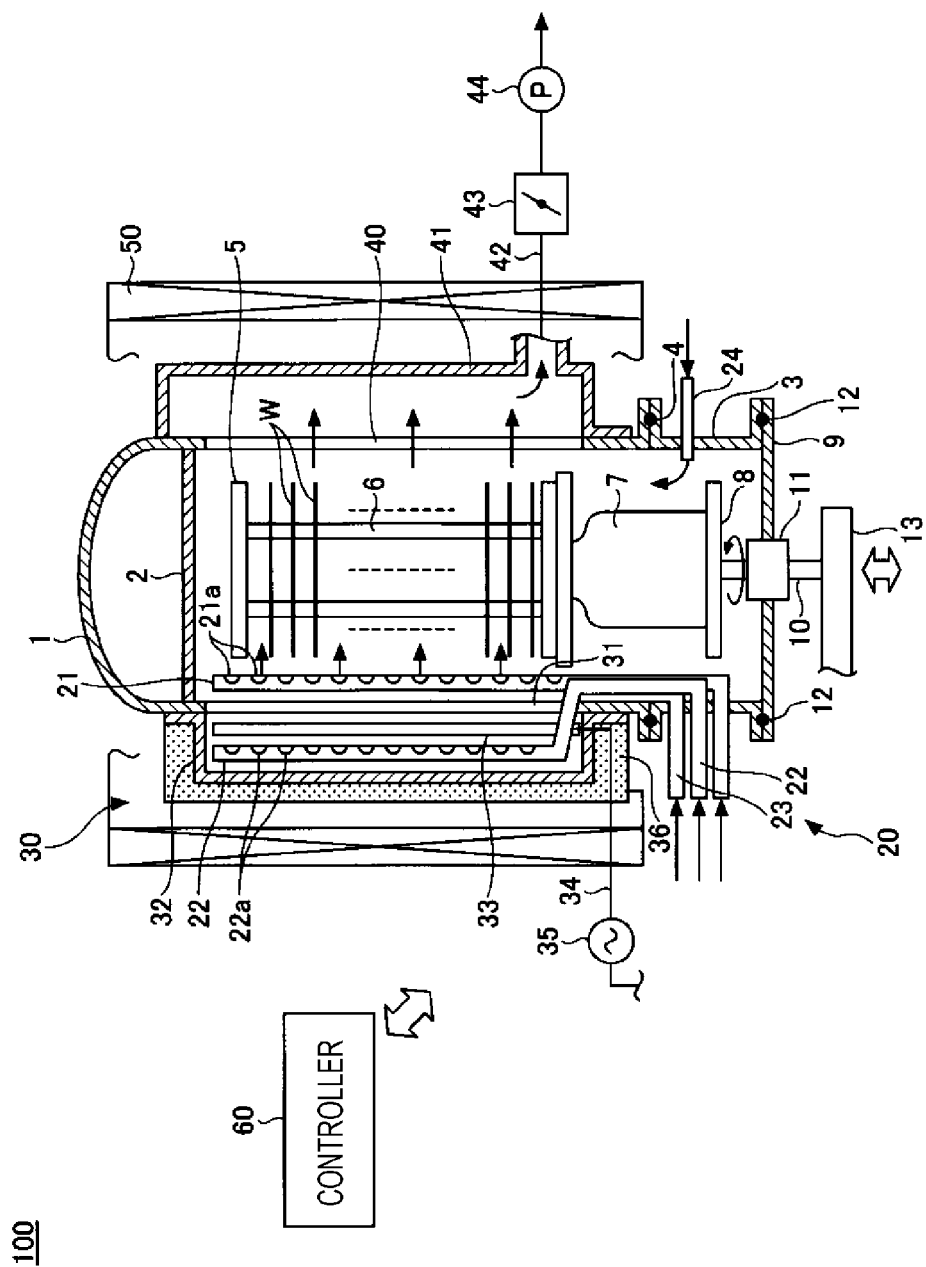
FIG. 1 is a cross-sectional view of a plasma processing apparatus according to a first embodiment.

In the following detailed description, reference is made to the accompanying drawings which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. Throughout the drawings, the same or corresponding members or components will be denoted by the same or corresponding reference numerals, and overlapping descriptions thereof will be omitted.

First Embodiment

Figure 2:
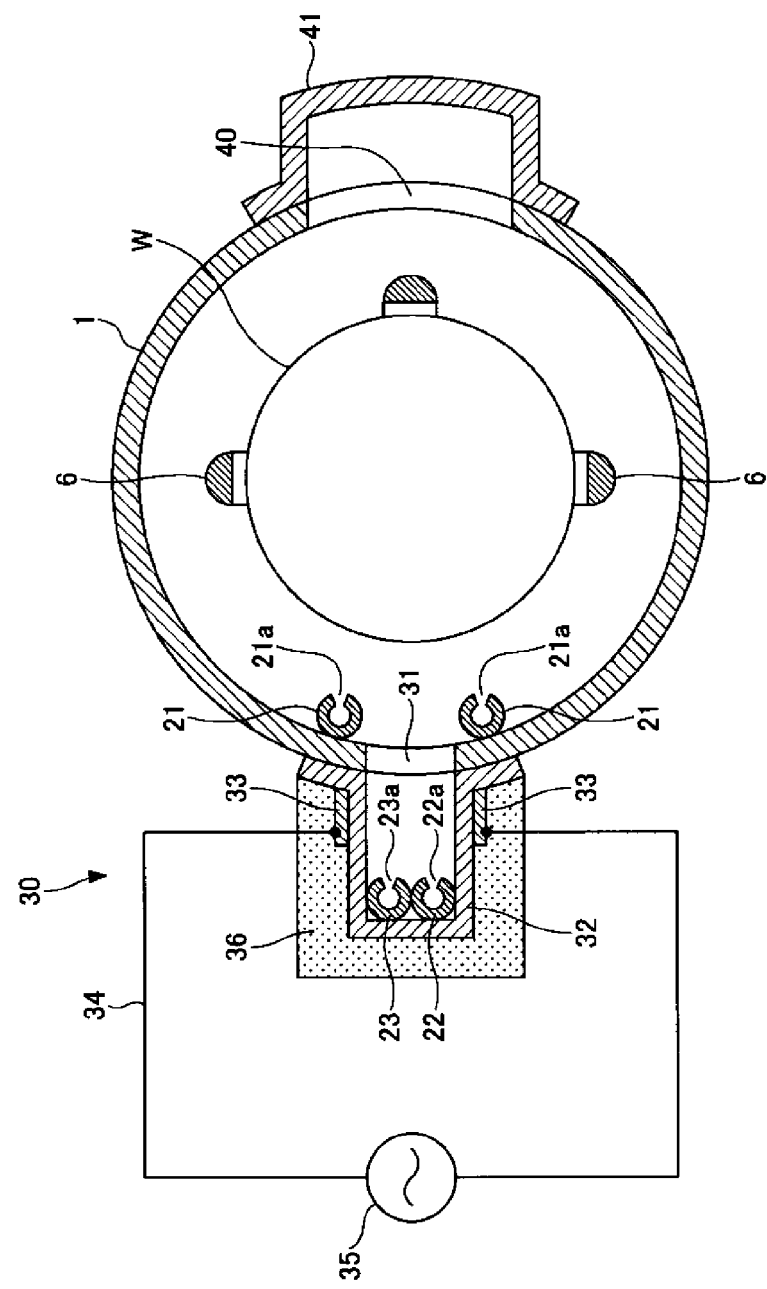
FIG. 2 is a cross-sectional view illustrating a plasma generation mechanism of the plasma processing apparatus of FIG. 1.
Figure 3:
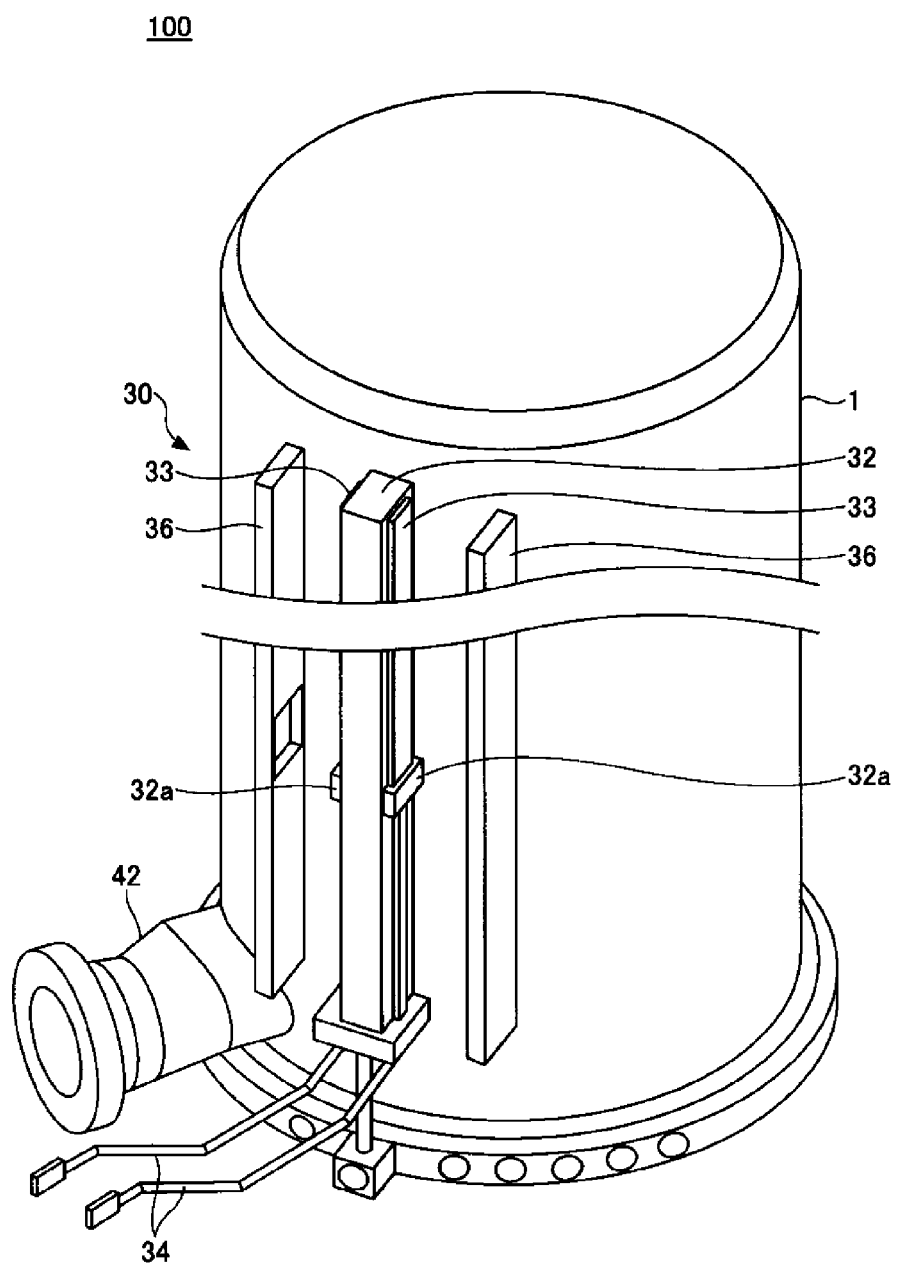
FIG. 3 is a perspective view illustrating a plasma generation mechanism of the plasma processing apparatus of FIG. 1.

A plasma processing apparatus according to a first embodiment will be described. FIG. 1 is a cross-sectional view illustrating the plasma processing apparatus according to the first embodiment. FIG. 2 is a cross-sectional view illustrating a plasma generation mechanism of the plasma processing apparatus of FIG. 1. FIG. 3 is a perspective view illustrating the plasma generation mechanism of the plasma processing apparatus of FIG. 1.

A plasma processing apparatus 100 includes a processing container 1 which is long in the vertical direction. The processing container 1 has a cylindrical shape having a ceiling and an opened lower end. The entire processing container 1 is made of, for example, quartz. A ceiling plate 2 formed of quartz is provided near the upper end of the processing container 1 inside the processing container 1, and the region below the ceiling plate 2 is sealed. A manifold 3 formed of a metal in a cylindrical shape is connected to the opening at the lower end of the processing container 1 via a seal member 4 such as an O-ring.

The manifold 3 supports the lower end of the processing container 1, and a wafer boat 5 is inserted into the processing container 1 from the lower portion of the manifold 3. In the wafer boat 5, a large number of (e.g., 25 to 150) semiconductor wafers (hereinafter, referred to as "wafers W") are arranged in multiple stages. In this way, a large number of wafers W are accommodated substantially horizontally at intervals along the vertical direction in the processing container 1. The wafer boat 5 is made of, for example, quartz.

The wafer boat 5 has three rods 6 (see FIG. 2), and a large number of wafers W are supported by grooves (not illustrated) formed in the rods 6.

The wafer boat 5 is placed on a table 8 via a heat reserving cylinder 7 made of quartz. The table 8 is supported on a rotary shaft 10 that penetrates a lid 9 made of a metal (stainless steel) and configured to open/close the opening of the lower end of the manifold 3.

A magnetic fluid seal 11 is provided at the penetrating portion of the rotary shaft 10, and airtightly seals and rotatably supports the rotary shaft 10. A seal member 12 is provided between the peripheral portion of the lid 9 and the lower end of the manifold 3 to maintain the airtightness inside the processing container 1.

The rotary shaft 10 is attached to the tip of an arm 13 supported by a lifting mechanism (not illustrated) such as a boat elevator, and the wafer boat 5 and the lid 9 are moved up and down in an integrated form and inserted/removed into/from the processing container 1. The table 8 may be provided to be fixed to the lid 9, and the wafers W may be processed without rotating the wafer boat 5.

Further, the plasma processing apparatus 100 includes a gas supply 20 that supplies a predetermined gas such as a processing gas or a purge gas into the processing container 1.

The gas supply 20 includes gas supply pipes 21, 22, 23, and 24. The gas supply pipes 21, 22, and 23 are made of, for example, quartz, penetrate the side wall of the manifold 3 inward, are bent upward, and extend vertically. A plurality of gas holes 21a, 22a, and 23a are formed at predetermined intervals in the vertical portions of the gas supply pipes 21, 22, and 23, respectively, over the vertical length corresponding to the range of the wafer boat 5 that supports the wafers. Each of the gas holes 21a, 22a, 23a injects a gas horizontally. The gas supply pipe 24 is made of, for example, quartz, and includes a short quartz pipe provided to penetrate the side wall of the manifold 3. In the illustrated example, two gas supply pipes 21, one gas supply pipe 22, one gas supply pipe 23, and one gas supply pipe 24 are provided.

The vertical portion of each gas supply pipe 21 is provided inside the processing container 1. A gas containing a film-forming raw material (hereinafter, referred to as a "raw material gas") is supplied to the gas supply pipe 21 from a raw material gas supply source through a gas pipe. The gas pipe is provided with a flow rate controller and an opening/closing valve. Accordingly, the raw material gas from the raw material gas supply source is supplied into the processing container 1 through the gas pipe and the gas supply pipe 21. Examples of the raw material gas may include a silicon compound containing chlorine (Cl) such as dichlorosilane (DCS; $SiH_2Cl_2$), monochlorosilane (MCS; $SiH_3Cl$), trichlorosilane (TCS; $SiHCl_3$), silicon tetrachloride (STC; $SiCl_4$) or hexachlorodisilane (HCD; $Si_2Cl_6$).

The vertical portion of the gas supply pipe 22 is provided in a plasma generation space to be described later. Hydrogen ($H_2$) gas is supplied to the gas supply pipe 22 from a hydrogen gas supply source through a gas pipe. The gas pipe is provided with a flow rate controller and an opening/closing valve. Accordingly, the $H_2$ gas from the hydrogen gas supply source is supplied to the plasma generation space through the gas pipe and the gas supply pipe 22, is turned into plasma in the plasma generation space, and is supplied into the processing container 1.

The vertical portion of the gas supply pipe 23 is provided in the plasma generation space to be described later. Nitriding gas is supplied to the gas supply pipe 23 from a nitriding gas supply source through a gas pipe. The gas pipe is provided with a flow rate controller and an opening/closing valve. Accordingly, the nitriding gas from the nitriding gas supply source is supplied to the plasma generation space through the gas pipe and the gas supply pipe 23, is turned into plasma in the plasma generation space, and is supplied into the processing container 1. Examples of the nitriding gas may include an organic hydrazine compound such as ammonia ($NH_3$), nitrogen ($N_2$), diazene ($N_2H_2$), hydrazine ($N_2H_4$) or monomethylhydrazine ($CH_3(NH)NH_2$).

The purge gas is supplied to the gas supply pipe 24 from a purge gas supply source through a gas pipe. The gas pipe is provided with a flow rate controller and an opening/closing valve. Accordingly, the purge gas from the purge gas supply source is supplied into the processing container 1 through the gas pipe and the gas supply pipe 24. Examples of the purge gas may include an inert gas such as argon (Ar) or nitrogen ($N_2$). While descriptions have been made on a case where the purge gas is supplied from the purge gas supply source into the processing container 1 through the gas pipe and the gas supply pipe 24, the present disclosure is not limited thereto. The purge gas may be supplied to any one of the gas supply pipes 21, 22, and 23.

A plasma generation mechanism 30 is formed at a portion of the side wall of the processing container 1. The plasma generation mechanism 30 turns the nitriding gas into plasma to generate nitriding active species, and turns the $H_2$ gas into plasma to further generate hydrogen (H) radicals.

The plasma generation mechanism 30 includes a plasma partition wall 32, a pair of plasma electrodes 33, a power feed line 34, a radio-frequency power supply 35, and an insulating protection cover 36.

The plasma partition wall 32 is airtightly welded to the outer wall of the processing container 1. The plasma partition wall 32 is formed of, for example, quartz. The plasma partition wall 32 has a recessed cross section, and covers an opening 31 formed in the side wall of the processing container 1. The opening 31 is formed to be vertically elongated so as to cover all of the wafers W supported in the wafer boat 5 along the vertical direction. The gas supply pipe 22 for injecting the $H_2$ gas and the gas supply pipe 23 for injecting the nitriding gas are arranged in the inner space that is defined by the plasma partition wall 32 and communicates with the inside of the processing container 1, that is, the plasma generation space. The gas supply pipes 21 for injecting the raw material gas are provided near the wafers W along the inner side wall of the processing container 1 outside the plasma generation space. In the illustrated example, the two gas supply pipes 21 are arranged at positions between which the opening 31 is disposed. However, the present disclosure is not limited thereto, and for example, only one of the two gas supply pipes 21 may be disposed.

The pair of plasma electrodes 33 each have an elongated shape, and are arranged on the outer surfaces of both side walls of the plasma partition wall 32 along the vertical direction while facing each other. Each plasma electrode 33 is held by, for example, a holder 32a provided on the side surface of the plasma partition wall 32. The power feed line 34 is connected to the lower end of each plasma electrode 33. Hereinafter, the position where the plasma electrode 33 and the power feed line 34 are connected to each other may be referred to as a power feed position.

Figure 4:
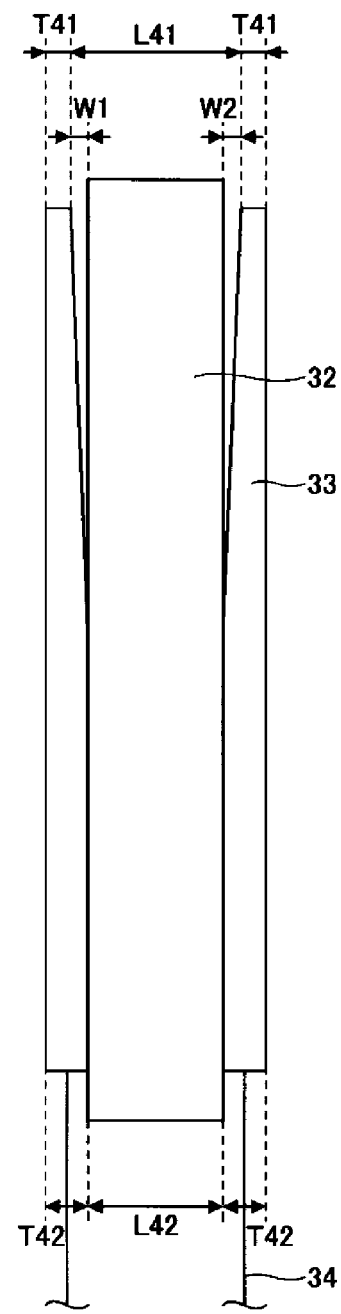
FIG. 4 is a view illustrating plasma electrodes of the plasma generation mechanism of FIG. 4.

FIG. 4 is a view illustrating the plasma electrodes 33 of the plasma generation mechanism 30. The pair of plasma electrodes 33 each have a rectangular flat plate shape including a long side and a short side in a plan view, and are symmetrically arranged with the plasma partition wall 32 interposed therebetween. Each plasma electrode 33 is formed such that a thickness T41 at the upper end position is thinner than a thickness T42 at the power feed position, and thus, an inter-electrode distance L41 at the upper end position is longer than an inter-electrode distance L42 at the power feed position. In the example of FIG. 4, each plasma electrode 33 is processed into an inclined shape such that the gap between the plasma electrode 33 and the plasma partition wall 32 increases toward the upper end position from the power feed position. However, each plasma electrode 33 may be configured such that the inter-electrode distance L41 at the upper end position is longer than the inter-electrode distance L42 at the power feed position, and for example, may be processed into a step shape such that the gap between the plasma electrode 33 and the plasma partition wall 32 increases toward the upper end position from the power feed position.

The sum of a width W1 of the gap between one plasma electrode 33 and the plasma partition wall 32 at the upper end position and a width W2 of the gap between the other plasma electrode 33 and the plasma partition wall 32 at the upper end position may be, for example, 10% to 20% of the inter-electrode distance L41 at the upper end position.

The power feed line 34 electrically connects each plasma electrode 33 and the radio-frequency power supply 35 to each other. In the illustrated example, one end of the power feed line 34 is connected to the lower end of each plasma electrode 33 which is a lateral portion of the short side of the plasma electrode 33, and the other end thereof is connected to the radio-frequency power supply 35.

The radio-frequency power supply 35 is connected to the lower end of each plasma electrode 33 via the power feed line 34, and supplies a radio-frequency power of, for example, 13.56 MHz to the pair of plasma electrodes 33. As a result, the radio-frequency power is applied to the plasma generation space defined by the plasma partition wall 32. The $H_2$ gas injected from the gas supply pipe 22 is turned into plasma in the plasma generation space to which the radio frequency power is applied, and hydrogen radicals generated by the plasma are supplied into the processing container 1 through the opening 31. Further, the nitriding gas injected from the gas supply pipe 23 is turned into plasma in the plasma generation space to which the radio-frequency power is applied, and nitriding active species generated by the plasma are supplied into the processing container 1 through the opening 31.

The insulating protection cover 36 is attached to the outer side of the plasma partition wall 32 so as to cover the plasma partition wall 32. A coolant passage (not illustrated) is provided inside the insulating protection cover 36, and a coolant such as cooled nitrogen ($N_2$) gas flows in the coolant passage so that the plasma electrodes 33 are cooled. Further, a shield (not illustrated) may be provided between the plasma electrodes 33 and the insulating protection cover 36 to cover the plasma electrodes 33. The shield is made of, for example, a good conductor such as a metal, and is grounded.

An exhaust port 40 is provided in the side wall portion of the processing container 1 to evacuate the inside of the processing container 1. The exhaust port 40 is formed in a vertically elongated shape that corresponds to the wafer boat 5. An exhaust port cover member 41 is attached to the portion that corresponds to the exhaust port 40 of the processing container 1, and has a U-shaped cross section to cover the exhaust port 40. The exhaust port cover member 41 extends upward along the side wall of the processing container 1. An exhaust pipe 42 is connected to the lower portion of the exhaust port cover member 1 to exhaust the processing container 1 through the exhaust port 40. An exhaust device 44 is connected to the exhaust pipe 42, and includes a pressure control valve 43 that controls the pressure inside the processing container 1, a vacuum pump and others. The inside of the processing container 1 is exhausted by the exhaust device 44 through the exhaust pipe 42.

Further, a cylindrical heating mechanism 50 is provided to surround the outer periphery of the processing container 1, to heat the processing container 1 and the wafers W inside the processing container 1.

Further, the plasma processing apparatus 100 includes a controller 60. The controller 60 controls, for example, the operation of each unit of the plasma processing apparatus 100, and for example, controls the supply/stop of each gas by opening/closing of the opening/closing valve, the gas flow rate by the flow rate controller, and the exhaust by the exhaust device 44. Further, the controller 60 controls, for example, the ON/OFF of the radio-frequency power by the radio-frequency power supply 35 and the temperature of the wafers W by the heating mechanism 50.

The controller 60 may be, for example, a computer. Further, a computer program for performing the operation of each unit of the plasma processing apparatus 100 is stored in a storage medium. The storage medium may be, for example, a flexible disk, a compact disk, a hard disk, a flash memory or a DVD.

Next, an example of a film forming method which is performed by the plasma processing apparatus 100 will be described. Herein below, descriptions will be made on an example where DCS gas is used as the raw material gas, $NH_3$ gas is used as the nitriding gas, and $N_2$ gas is used as the purge gas.

First, the temperature inside the processing container 1 is set to 300° C. to 630° C., the wafer boat 5 with 25 to 175 wafers W mounted therein is carried into the processing container 1, and the pressure inside the processing container 1 is adjusted to 15 Pa to 70 Pa by exhausting the inside the processing container 1 with the exhaust device 44.

In this state, a purging process (step S1), a raw material gas supplying process (step S2), a hydrogen radical purging process (step S3), a purging process (step S4), and a nitriding gas supplying process (step S5) are repeated a predetermined number of times, so as to form an SiN film having a predetermined film thickness.

The purging processes of steps S1 and S4 are performed by supplying the $N_2$ gas as the purge gas from the purge gas supply source into the processing container 1 while exhausting the inside of the processing container 1 by the exhaust device 44. As a result, the atmosphere in the processing container 1 is replaced with the $N_2$ gas. As for the conditions suitable for step S1, $N_2$ gas flow rate: 500 sccm to 2,000 sccm, and time: 1 to 10 seconds.

In the raw material gas supplying process of step S2, the DCS gas is supplied as the raw material gas from the raw material gas supply source into the processing container 1, so as to adsorb Si onto the surfaces of the wafers W. As for the conditions suitable for step S2, DCS gas flow rate: 1,000 sccm to 3,000 sccm, and time: 1 to 10 seconds.

In the hydrogen radical purging process of step S3, the $H_2$ gas is supplied from the hydrogen gas supply source into the processing container 1 while existing the inside of the processing container 1, and the plasma generation mechanism 30 turns the $H_2$ gas into plasma to generate hydrogen radicals. Then, the hydrogen radicals are caused to act on the Si adsorbed in step S2. As for the conditions suitable for step S3, radio-frequency power: 50 W to 300 W, $H_2$ gas flow rate: 500 sccm to 5,000 sccm, and time: 5 to 100 seconds.

In the nitriding gas supplying process of step S5, the $NH_3$ gas is supplied as the nitriding gas from the nitriding gas supply source into the processing container 1, and the plasma generation mechanism 30 turns the $NH_3$ gas into plasma to generate nitriding active species such that the Si adsorbed in step S2 is nitrided. As for the conditions suitable for step S5, radio-frequency power: 30 W to 300 W, $NH_3$ gas flow rate: 2,000 sccm to 7,000 sccm, and time: 8 to 30 seconds.

The order of performing the hydrogen radical purging process of step S3 and the purging process of step S4 may be exchanged.

Next, the operation and effect of the plasma processing apparatus 100 will be described. In the plasma processing apparatus of the related art, in a case where the radio-frequency power is applied from the lower end of the plasma electrode 33, the upper end position distant from the lower end position which is the power feed position has an open end. Thus, the electric field strength in the plane of the plasma electrode exhibits a distribution in which the electric field strength increases toward the upper end position of the open end from the lower end position (hereinafter, also referred to as "open end effect"). When the electric field strength in the plane of the plasma electrode has the distribution described above, there is a tendency that particles generated from the plasma generation space during the film formation increase toward the upper portion of the plasma generation space and decrease toward the lower portion of the plasma generation space. That is, a correlation is found between the amount of generated particles and the electric field strength in the plane of the plasma electrode. This would be because the increase of the electric field in the plane of the plasma electrode causes the increase of an electrical potential difference that occurs in an ion sheath generated between plasma and the plasma partition wall 32, and thus, a damage to the wall surface due to ions accelerated by the voltage increases.

Meanwhile, in the plasma processing apparatus 100 of the first embodiment, each plasma electrode 33 is formed such that the thickness T41 at the upper end position is thinner than the thickness T42 at the power feed position, and thus, the inter-electrode distance L41 at the upper end position is longer than the inter-electrode distance L42 at the lower end position. As a result, the open end effect is suppressed so that the uniformity of the electric field strength along the longitudinal direction of the processing container 1 is improved. The electric field strength at the upper end position decreases, so that the amount of particles generated in the upper portion of the plasma generation space may be reduced.

Second Embodiment

A plasma processing apparatus according to a second embodiment will be described. The plasma processing apparatus of the second embodiment is different from the plasma processing apparatus 100 of the first embodiment in that in the second embodiment, the pair of plasma electrodes are arranged to be spaced apart from each other as a distance from the power feed position increases. In addition, since the other descriptions are the same as those for the plasma processing apparatus 100 of the first embodiment, the second embodiment will be described below based on the difference.

Figure 5:
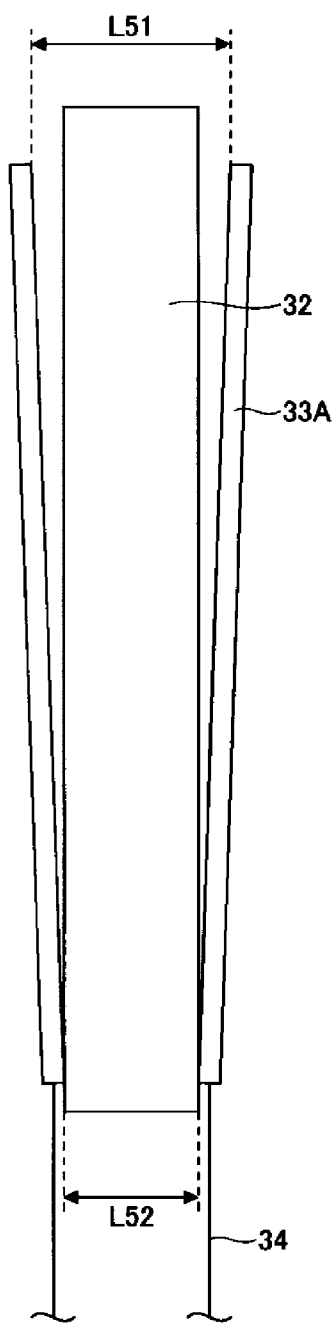
FIG. 5 is a view illustrating plasma electrodes of a plasma processing apparatus according to a second embodiment.

FIG. 5 is a view illustrating the plasma electrodes of the plasma processing apparatus according to the second embodiment. As illustrated in FIG. 5, the pair of plasma electrodes 33A each have a rectangular flat plate shape including a long side and a short side in a plan view, and are symmetrically arranged with the plasma partition wall 32 interposed therebetween. The plasma electrodes 33A are arranged such that the inter-electrode distance increases as the distance from the power feed position increases, and thus, an inter-electrode distance L51 at the upper end position is longer than an inter-electrode distance L52 at the power feed position. In the example of FIG. 5, each plasma electrode 33A has the same or substantially the same in-plane thickness, and is disposed to be inclined such that the gap between the plasma electrode 33A and the plasma partition wall 32 increases toward the upper end position from the power feed position.

In the plasma processing apparatus of the second embodiment, the pair of plasma electrodes 33A are arranged such that the inter-electrode distance increases as the distance from the power feed position increases, and thus, the inter-electrode distance L51 at the upper end position is longer than the inter-electrode distance L52 at the lower end position (the power feeding position). As a result, the open end effect is suppressed so that the uniformity of the electric field strength along the longitudinal direction of the processing container 1 is improved. Further, the electric field strength at the upper end position decreases, so that the amount of particles generated in the upper portion of the plasma generation space may be reduced.

Third Embodiment

A plasma processing apparatus according to a third embodiment will be described. The plasma processing apparatus of the third embodiment is different from the plasma processing apparatus 100 of the first embodiment in that in the third embodiment, each plasma electrode is disposed with a gap from the plasma partition wall, and a dielectric is provided at a lower portion of the gap. Since the other descriptions are the same as those for the plasma processing apparatus 100 of the first embodiment, the second embodiment will be described below based on the difference.

Figure 6A:
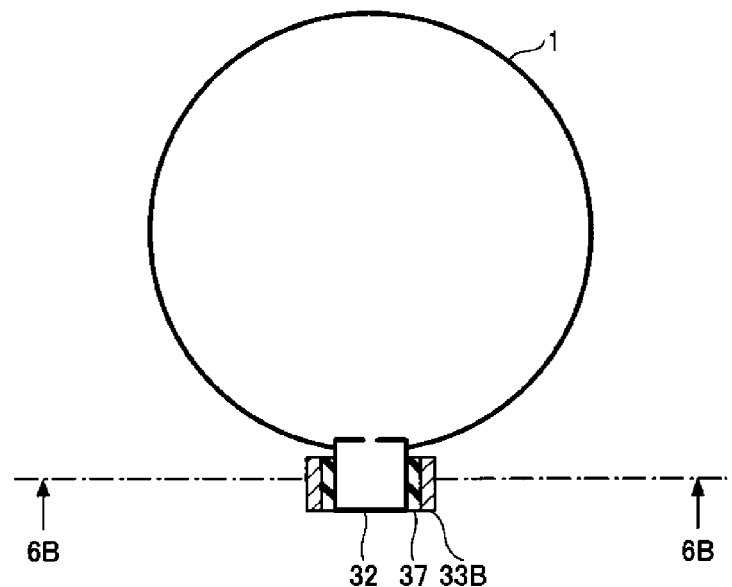
FIGS. 6A and 6B are views illustrating plasma electrodes of a plasma processing apparatus according to a third embodiment.
Figure 6B:
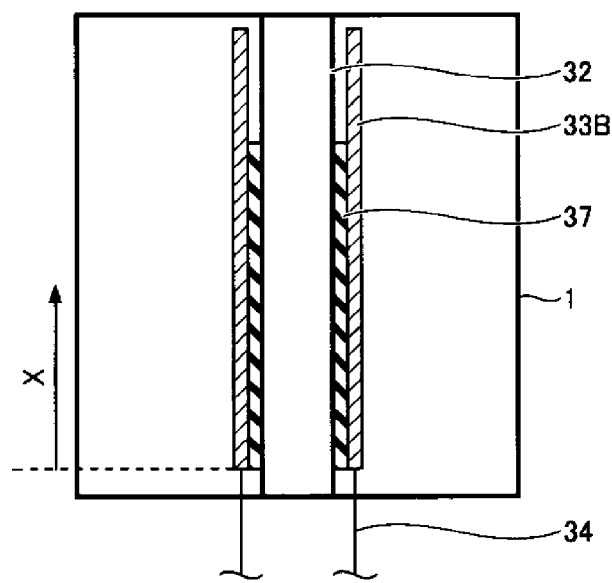

FIGS. 6A and 6B are views illustrating the plasma electrodes of the plasma processing apparatus according to the third embodiment. FIG. 6A represents the horizontal cross section of the processing container and the plasma generation mechanism, and FIG. 6B represents the cross section taken along the alternate long and short dash line 6B-6B in FIG. 6A.

As illustrated in FIGS. 6A and 6B, each plasma electrode 33B is disposed with a gap from the plasma partition wall 32. A dielectric 37 is provided in the lower portion of the gap. Meanwhile, the dielectric 37 is not provided in the upper portion of the gap. The dielectric 37 may be made of any material with a relative permittivity larger than 1, and examples thereof may include a dielectric with a high permittivity such as, for example, high-purity alumina ($Al_2O_3$), aluminum nitride (AlN), yttria ($Y_2O_3$), forsterite ($Mg_2SiO_4$) or mullite ($3Al_2O_3 \cdot 2SiO_2$).

Meanwhile, the inter-electrode electrostatic capacity between the pair of plasma electrodes is defined as $C_1$, the permittivity corresponding to $C_1$ and the thickness thereof are defined as $\varepsilon_1$ and $d_1$, respectively, and the area of the dielectric is defined as $A_1$. Further, when the radio-frequency power applied to the pair of plasma electrodes is defined as P, the power supply angular frequency of the radio frequency is defined as $\omega$, the current flowing between the electrodes $I_1 = \omega C_1 V_0 \cos \omega t$, and the inter-electrode voltage $V_1 = V_0 \sin \omega t$, the relationship expressed by Equation (1) below is obtained.

$$P = V_1 I_1 = V_0^2 \omega C_1 \sin\omega t \cos\omega t = \frac{1}{2} V_0^2 \omega \varepsilon_1 \frac{A_1}{d_1} \cos 2\omega t \quad (1)$$

It is assumed that a gap exists between each of both the plasma electrodes 33B and the plasma partition wall 32, the electrostatic capacity of the gap is $C_b$, the permittivity corresponding to $C_b$ and the thickness thereof are $\varepsilon_b$ and $d_b$, respectively, and the area of the dielectric is $A_1$. Similarly, it is assumed that the electrostatic capacity of the plasma partition wall 32 (quartz glass wall) between both the electrodes are $C_q$, and the permittivity corresponding to $C_q$ and the thickness thereof are $\varepsilon_q$ and $d_q$, respectively. Further, regarding the ion sheath generated in the plasma as a dielectric, it is assumed that the electrostatic capacity of the dielectric is $C_s$, and the permittivity corresponding to $C_s$ and the thickness thereof are $\varepsilon_s$ and $d_s$, respectively. Assuming that the total inter-electrode electrostatic capacity $C_1$ is made up by $C_b$, $C_q$, and $C_s$ connected in series, the total electrostatic capacity $C_1$ is expressed by Equation (2) below.

$$C_1 = \frac{1}{\frac{1}{C_b} + \frac{1}{C_q} + \frac{1}{C_s}} = \frac{A_1}{\frac{d_b}{\varepsilon_b} + \frac{d_q}{\varepsilon_q} + \frac{d_s}{\varepsilon_s}} \quad (2)$$

When Equation (2) is substituted into Equation (1), the radio-frequency power P applied to the electrodes is expressed by Equation (3) below.

$$P = V_1 I_1 = V_0^2 \omega C_1 \sin\omega t \cos\omega t = \frac{1}{2} V_0^2 \omega \frac{A_1}{\frac{d_b}{\varepsilon_b} + \frac{d_q}{\varepsilon_q} + \frac{d_s}{\varepsilon_s}} \cos 2\omega t \quad (3)$$

When the sum of the voltages between both the electrodes and the plasma partition wall is $V_b$, the voltage applied to the quartz glass wall is $V_q$, and the voltage applied to the ion sheath is $V_s$, $V_0 = V_b + V_q + V_s$.

Further, the relationship between $V_s$ and $V_0$ is expressed by Equation (4) below.

$$V_0 = V_s \frac{\frac{1}{C_b} + \frac{1}{C_q} + \frac{1}{C_s}}{\frac{1}{C_s}} = V_s \frac{\frac{d_b}{\varepsilon_b} + \frac{d_q}{\varepsilon_q} + \frac{d_s}{\varepsilon_s}}{\frac{d_s}{\varepsilon_s}} \quad (4)$$

When Equation (4) is substituted into Equation (3), the radio-frequency power P is expressed by Equation (5) below.

$$P = V_1 I_1 = V_0^2 \omega C_1 \sin\omega t \cos\omega t = \frac{1}{2} V_s^2 \omega \frac{\frac{d_b}{\varepsilon_b} + \frac{d_q}{\varepsilon_q} + \frac{d_s}{\varepsilon_s}}{\left(\frac{d_s}{\varepsilon_s}\right)^2} \cos 2\omega t \quad (5)$$

In Equation (5), when the radio-frequency power P applied to the plasma electrodes is constant, $V_0$ is also constant. Thus, as the distance $d_b$ between the plasma electrode 33B and the plasma partition wall 32 increases, $V_s$ decreases. Further, as the permittivity $\varepsilon_b$ between the plasma electrode 33B and the plasma partition wall 32 decreases, $V_s$ decreases.

Figure 7:
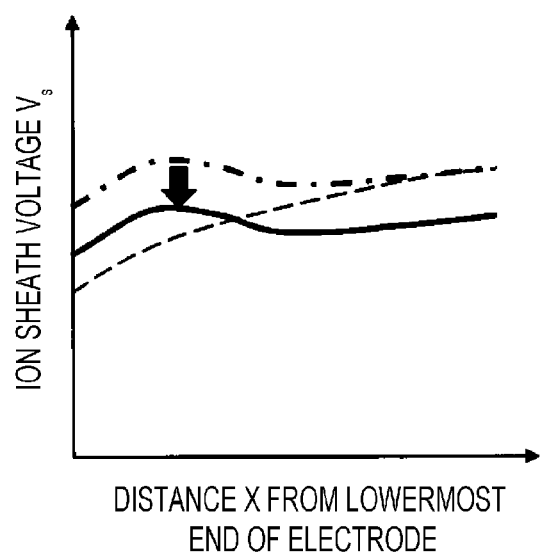
FIG. 7 is a view illustrating a relationship between a distance from a lower end of a plasma electrode and an ion sheath voltage.

FIG. 7 is a view illustrating a relationship between the distance X from the lower end of the plasma electrode 33B and the voltage $V_s$ (maximum value) generated in the ion sheath (hereinafter, referred to as an "ion sheath voltage"). In FIG. 7, the horizontal axis represents the distance X from the lower end of the plasma electrode 33B, and the vertical axis represents the ion sheath voltage $V_s$. Further, in FIG. 7, the alternate long and short dash line represents the ion sheath voltage $V_s$ in a case where the dielectric 37 is provided in the lower portion of the gap between each plasma electrode 33B and the plasma partition wall 32, and the dashed line represents the ion sheath voltage $V_s$ in a case where the dielectric 37 is not provided in the gap. The solid line represents a case where the dielectric 37 is provided in the lower portion of the gap between each plasma electrode 33B and the plasma partition wall 32, and also represents a case where the ion sheath voltage $V_s$ is averaged by slightly reducing the radio-frequency power.

In the plasma processing apparatus of the third embodiment, each plasma electrode 33B is disposed with a gap from the plasma partition wall 32, and the dielectric 37 is provided in the lower portion of the gap and is not provided in the upper portion of the gap. As a result, as represented by the alternate long and short dash line in FIG. 7, the open end effect is suppressed so that the uniformity of the ion sheath voltage $V_s$ along the longitudinal direction of the processing container 1 is improved. Further, when the radio-frequency power applied to the plasma electrodes 33B is adjusted to be slightly reduced, the ion sheath voltage $V_s$ at the upper end position decreases as represented by the solid line of FIG. 7, so that the amount of particles generated in the upper portion of the plasma generation space may be reduced.

Meanwhile, as represented by the dashed line of FIG. 7, in a case where the dielectric 37 is not provided in the gap between each plasma electrode 33B and the plasma partition wall 32, the electric field strength in the plane of the plasma electrode has a distribution in which the electric field strength increases toward the upper end position of the open end from the lower end position. Thus, the ion sheath voltage $V_s$ on the side of the upper end of the plasma electrode also increases, and as a result, the amount of particles generated in the upper portion of the plasma generation space increases.

Fourth Embodiment

A plasma processing apparatus according to a fourth embodiment will be described. The plasma processing apparatus of the fourth embodiment is different from the plasma processing apparatus 100 of the first embodiment in that in the fourth embodiment, each plasma electrode is disposed with a gap from the plasma partition wall, and a dielectric is provided in the gap to have a thickness that becomes thinner toward the upper portion of the gap from the lower portion of the gap. Since the other descriptions are the same as those for the plasma processing apparatus 100 of the first embodiment, the fourth embodiment will be described below based on the difference.

Figure 8A:
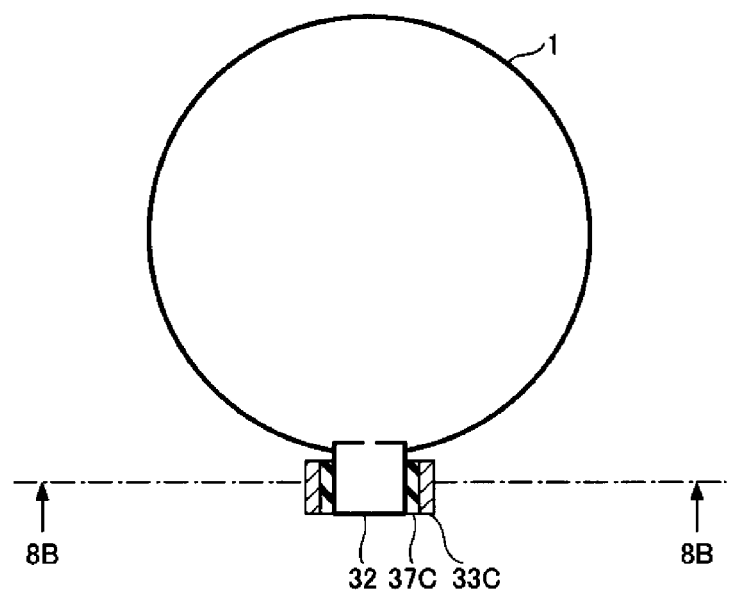
FIGS. 8A and 8B are views illustrating plasma electrodes of a plasma processing apparatus according to a fourth embodiment.
Figure 8B:
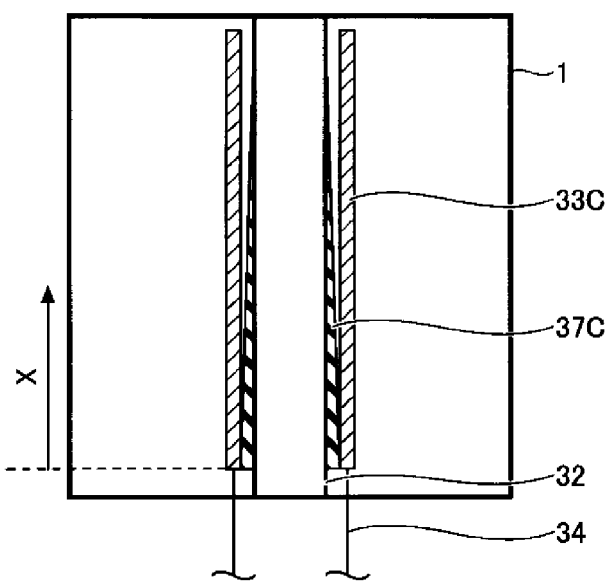

FIGS. 8A and 8B are views illustrating the plasma electrodes of the plasma processing apparatus according to the fourth embodiment. FIG. 8A represents a horizontal cross section of the processing container and the plasma generation mechanism, and FIG. 8B represents a cross section taken along the alternate long and short dash line 8B-8B in FIG. 8A.

As represented in FIGS. 8A and 8B, each plasma electrode 33C is disposed with a gap from the plasma partition wall 32. A dielectric 37C is provided in the gap to have a thickness that becomes thinner toward the upper portion of the gap from the lower portion of the gap. In the example of FIGS. 8A and 8B, the dielectric 37C is processed into an inclined shape such that the thickness of the dielectric 37C becomes thinner toward the upper portion from the lower portion. Meanwhile, the dielectric 37C may be formed such that the upper portion of the dielectric 37C becomes thinner than the lower portion thereof, and for example, may be processed into a step shape such that the thickness of the dielectric 37C becomes thinner toward the upper portion from the lower portion.

Figure 9:
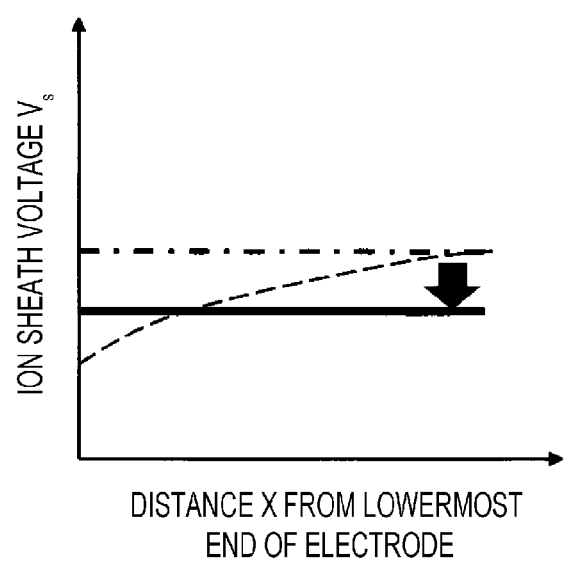
FIG. 9 is a view illustrating a relationship between a distance from a lower end of a plasma electrode and an ion sheath voltage.

FIG. 9 is a view illustrating a relationship between the distance X from the lower end of the plasma electrode 33C and the ion sheath voltage $V_s$. In FIG. 9, the horizontal axis represents the distance X from the lower end of the plasma electrode 33C, and the vertical axis represents the ion sheath voltage $V_s$. Further, in FIG. 9, the alternate long and short dash line represents the ion sheath voltage $V_s$ in a case where the dielectric 37C is provided in the gap between each plasma electrode 33C and the plasma partition wall 32, and the dashed line represents the ion sheath voltage $V_s$ in a case where the dielectric 37C is not provided in the gap. The solid line represents a case where the dielectric 37C is provided in the gap between each plasma electrode 33C and the plasma partition wall 32, and also represents a case where the ion sheath voltage $V_s$ is averaged by slightly reducing the radio-frequency power.

In the plasma processing apparatus of the fourth embodiment, each plasma electrode 33C is disposed with a gap from the plasma partition wall 32, and the dielectric 37C is provided in the gap to have a thickness that becomes thinner toward the upper portion from the lower portion. As a result, as represented by the alternate long and short dash line of FIG. 9, the open end effect is suppressed so that the uniformity of the ion sheath voltage $V_s$ along the longitudinal direction of the processing container 1 is improved. Further, when the radio-frequency power applied to the plasma electrode 33C is adjusted to be slightly reduced, the ion sheath voltage $V_s$ at the upper end position is reduced as represented by the solid line of FIG. 9, so that the amount of particles generated in the upper portion of the plasma generation space may be reduced.

Meanwhile, as represented by the dashed line of FIG. 9, in a case where the dielectric 37C is not provided in the gap between each plasma electrode 33C and the plasma partition wall 32, the electric field strength in the plane of the plasma electrode has a distribution in which the electric field strength increases toward the upper end position of the open end from the lower end position. Thus, the ion sheath voltage $V_s$ on the side of the upper end of the plasma electrode also increases, and as a result, the amount of particles generated in the upper portion of the plasma generation space increases.

Fifth Embodiment

A plasma processing apparatus according to a fifth embodiment will be described. The plasma processing apparatus of the fifth embodiment is different from the plasma processing apparatus 100 of the first embodiment in that in the fifth embodiment, each plasma electrode is disposed with a gap from the plasma partition wall, and a dielectric is provided in the gap to have a relative permittivity that becomes lower toward the upper portion of the gap from the lower portion of the gap. Since the other descriptions are the same as those for the plasma processing apparatus 100 of the first embodiment, the fifth embodiment will be described below based on the difference.

Figure 10A:
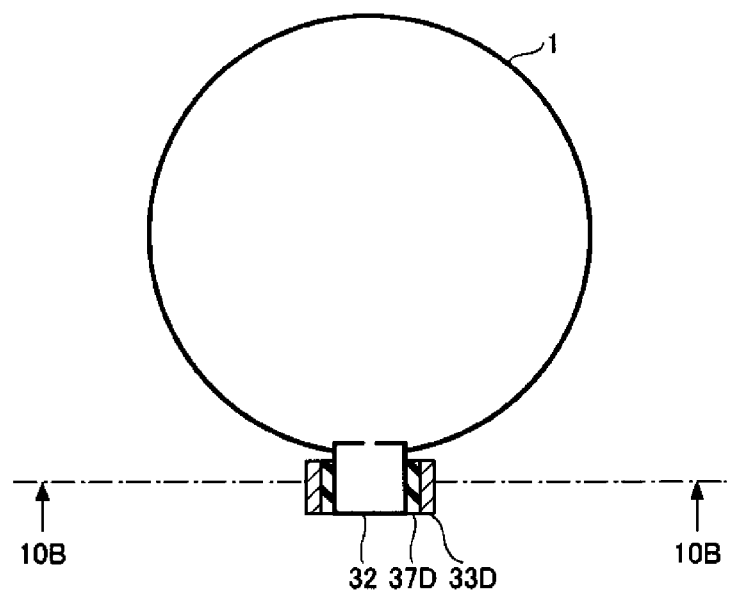
FIGS. 10A and 10B are views illustrating plasma electrodes of a plasma processing apparatus according to a fifth embodiment.
Figure 10B:
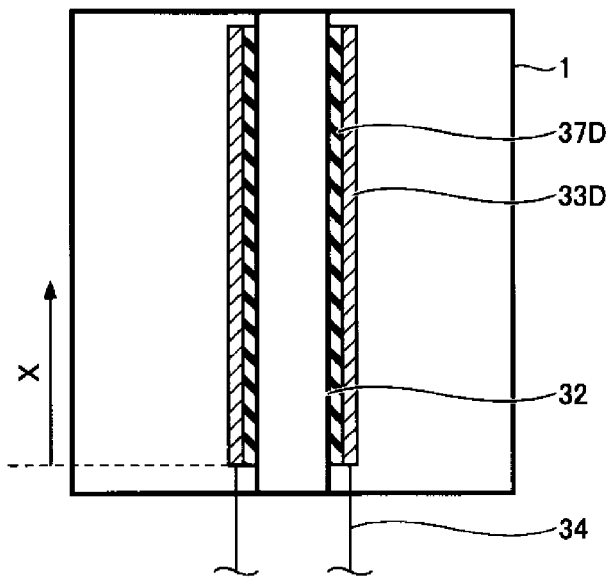

FIGS. 10A and 10B are views illustrating the plasma electrodes of the plasma processing apparatus according to the fifth embodiment. FIG. 10A represents a horizontal cross section of the processing container and the plasma generation mechanism, and FIG. 10B represents a cross section taken along the alternate long and short dash line 8B-8B in FIG. 10A.

As represented in FIGS. 10A and 10B, each plasma electrode 33D is disposed with a gap from the plasma partition wall 32. A dielectric 37D is provided in the gap to have a relative permittivity that becomes lower toward the upper portion from the lower portion. In the example of FIGS. 10A and 10B, the relative permittivity of the dielectric 37D becomes continuously lower toward the upper portion from the lower portion. Meanwhile, the dielectric 37D may have a relative permittivity that becomes lower toward the upper portion from the lower portion, and for example, dielectrics having different relative permittivities may be combined with each other. In this case, a dielectric having a relatively low relative permittivity is disposed on the side of the upper portion, and a dielectric having a relatively high relative permittivity is disposed on the side of the lower portion.

Figure 11:
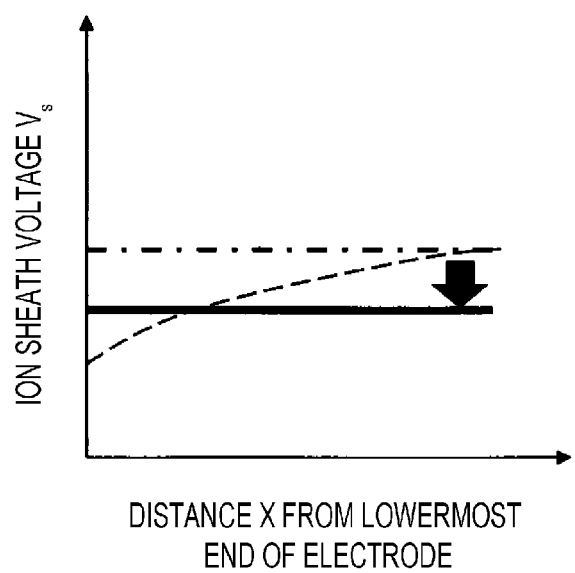
FIG. 11 is a view illustrating a relationship between a distance from a lower end of a plasma electrode and an ion sheath voltage.

FIG. 11 is a view illustrating a relationship between the distance X from the lower end of the plasma electrode 33D and the ion sheath voltage $V_s$. In FIG. 11, the horizontal axis represents the distance X from the lower end of the plasma electrode 33D, and the vertical axis represents the ion sheath voltage $V_s$. Further, in FIG. 11, the alternate long and short dash line represents the ion sheath voltage $V_s$ in a case where the dielectric 37D is provided in the gap between each plasma electrode 33D and the plasma partition wall 32, and the dashed line represents the ion sheath voltage $V_s$ in a case where the dielectric 37D is not provided in the gap. The solid line represents a case where the dielectric 37D is provided in the gap between each plasma electrode 33D and the plasma partition wall 32, and also represents a case where the ion sheath voltage $V_s$ is averaged by slightly reducing the radio-frequency power.

In the plasma processing apparatus of the fifth embodiment, each plasma electrode 33D is disposed with a gap from the plasma partition wall 32, and the dielectric 37D is provided in the gap to have a relative permittivity that becomes lower toward the upper portion from the lower portion. As a result, as represented by the alternate long and short dash line of FIG. 11, the open end effect is suppressed so that the uniformity of the ion sheath voltage $V_s$ along the longitudinal direction of the processing container 1 is improved. Further, when the radio-frequency power applied to the plasma electrodes 33D is adjusted to be slightly reduced, the ion sheath voltage $V_s$ at the upper end position decreases as represented by the solid line of FIG. 11, so that the amount of particles generated in the upper portion of the plasma generation space may be reduced.

Meanwhile, as represented by the dashed line of FIG. 11, in a case where the dielectric 37D is not provided in the gap between each plasma electrode 33D and the plasma partition wall 32, the electric field strength in the plane of the plasma electrode has a distribution in which the electric field strength increases toward the upper end position of the open end from the lower end position. Thus, the ion sheath voltage $V_s$ on the side of the upper end of the plasma electrode also increases, and as a result, the amount of particles generated in the upper portion of the plasma generation space increases.

Sixth Embodiment

A plasma processing apparatus according to a sixth embodiment will be described. The plasma processing apparatus of the sixth embodiment is different from the plasma processing apparatus 100 of the first embodiment in that in the sixth embodiment, the power feed position is in the middle of each plasma electrode in the vertical direction. Since the other descriptions are the same as those for the plasma processing apparatus 100 of the first embodiment, the sixth embodiment will be described below based on the difference.

Figure 12:
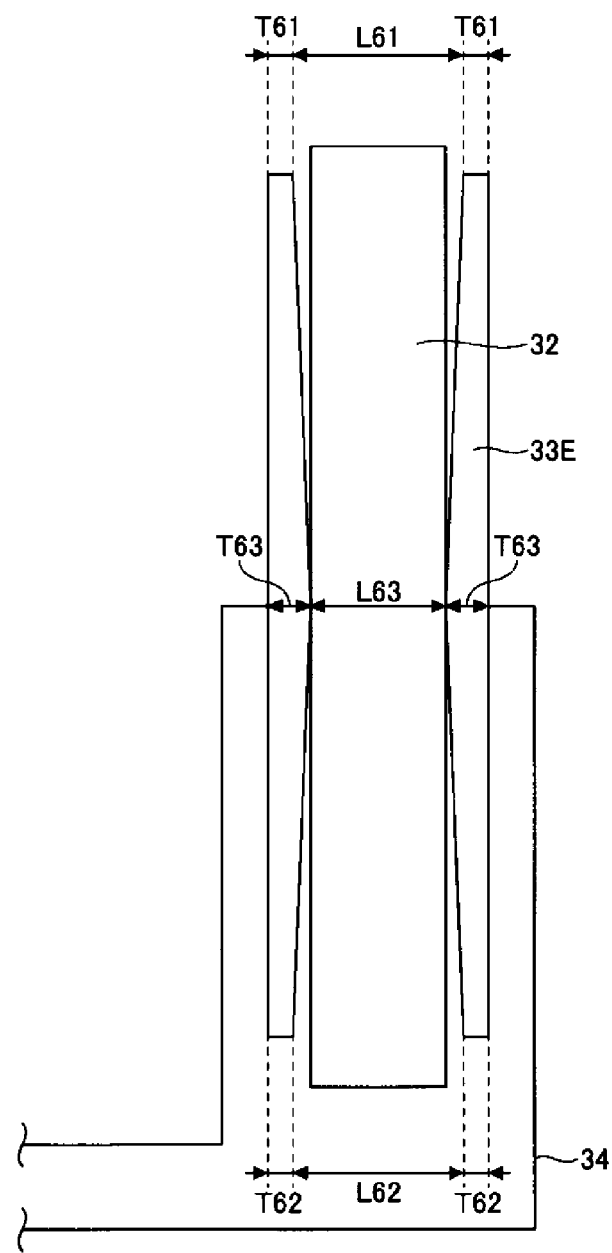
FIG. 12 is a view illustrating plasma electrodes of a plasma processing apparatus according to a sixth embodiment.

FIG. 12 is a view illustrating the plasma electrodes of the plasma processing apparatus according to the sixth embodiment. As illustrated in FIG. 12, a pair of plasma electrodes 33E each have a rectangular flat plate shape including a long side and a short side in a plan view, and are symmetrically arranged with the plasma partition wall 32 interposed therebetween. Each plasma electrode 33E is formed such that a thickness T61 at the upper end position and a thickness T62 at the lower end position are thinner than a thickness T63 at the power feed position, and thus, an inter-electrode distance L61 at the upper end position and an inter-electrode distance L62 at the lower end position are longer than an inter-electrode distance L63 at the power feed position. In the example of FIG. 12, each plasma electrode 33E is processed into an inclined shape such that the gap between the plasma electrode 33E and the plasma partition wall 32 increases toward the upper end position and the lower end position from the power feed position. Meanwhile, each plasma electrode 33E may be formed such that the inter-electrode distance L61 at the upper end position and the inter-electrode distance L62 at the lower end position are longer than the inter-electrode distance L63 at the power feed position. For example, each plasma electrode 33E may be processed in a step shape such that the gap between the plasma electrode 33E and the plasma partition wall 32 increases toward the upper end position and the lower end position from the power feed position.

The power feed line 34 electrically connects each plasma electrode 33E and the radio-frequency power supply 35 to each other. In the illustrated example, one end of the power feed line 34 is connected to the intermediate position of each plasma electrode 33E in the vertical direction, and the other end thereof is connected to the radio-frequency power supply 35.

In the plasma processing apparatus of the sixth embodiment, the thicknesses T61 and T62 of each plasma electrode 33E at the upper end position and the lower end position are thinner than the thickness T63 at the power feed position, such that the inter-electrode distances L61 and L62 at the upper end position and the lower end position are longer than the inter-electrode distance L63 at the power feed position (intermediate position). As a result, the open end effect is suppressed so that the uniformity of the electric field strength along the longitudinal direction of the processing container 1 is improved. Further, the electric field strength at the upper end position and the lower end position decreases, so that the amount of particles generated in the upper portion and the lower portion of the plasma generation space may be reduced.

According to the embodiments described above, as the gap between the pair of plasma electrodes, the electric length between the pair of plasma electrodes at least at the position close to the power feed position in the longitudinal direction of the processing container 1 is shorter than the electric length between the plasma electrodes at the position distant from the power feed position. As a result, the uniformity of the electric field strength along the longitudinal direction of the processing container 1 may be improved. Here, the electric length between the plasma electrodes is defined as a value obtained by dividing the length of each section of a plurality of sections sandwiched between the plasma electrodes and made up by various materials, by the relative permittivity of the materials that make up the corresponding section, and adding up the values in all of the sections.

EXAMPLE

A verification was conducted on the influence of the inter-electrode distance between the pair of plasma electrodes 33 on the distribution of the electric field strength in the plane of each plasma electrode, using a plasma processing apparatus having the same configuration as that of the plasma processing apparatus 100 of the first embodiment, and using the electromagnetic field analysis by the finite element method. In a simulation, the distribution of the electric field strength in the longitudinal direction of the plasma electrode 33 (the vertical direction of the processing container 1) was calculated for a case where the inter-electrode distance at the upper end position is longer than the inter-electrode distance at the power feed position. Further, for a comparison, the distribution of the electric field strength in the longitudinal direction of the plasma electrode 33 (the vertical direction of the processing container 1) was calculated for a case where the inter-electrode distance at the upper end position is the same as the inter-electrode distance at the power feed position.

Figure 13:
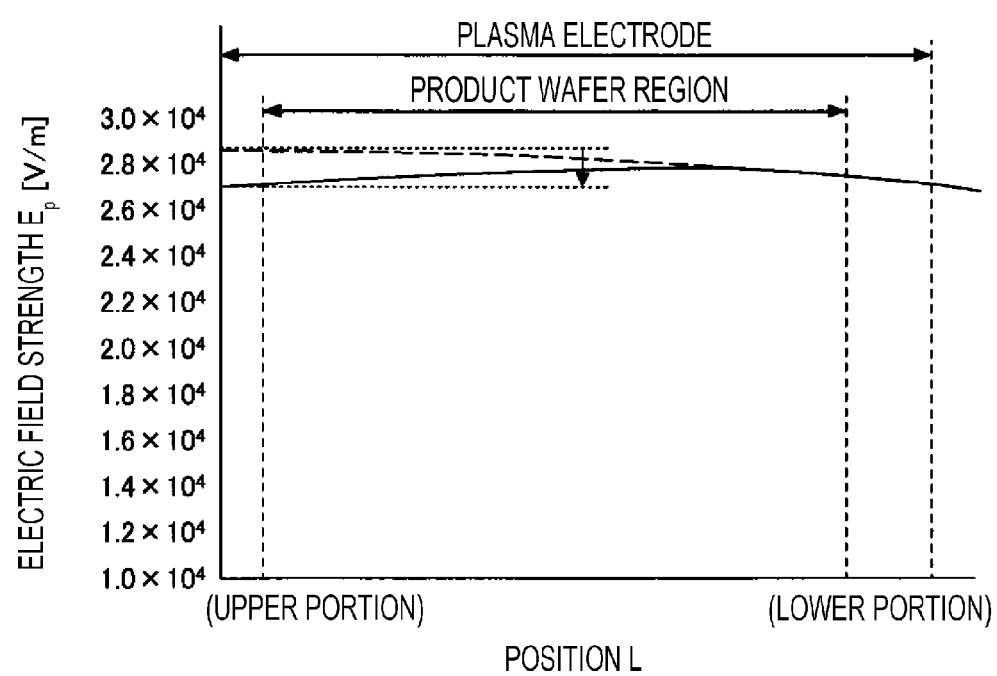
FIG. 13 is a view illustrating results of a simulation for a relationship between a position in a longitudinal direction of a plasma electrode and an electric field strength.

FIG. 13 is a view illustrating a simulation result of a relationship between a position L in the longitudinal direction of the plasma electrode and the electric field strength $E_p$. In FIG. 13, the horizontal axis represents the position L in the longitudinal direction of the plasma electrode 33, and the vertical axis represents the electric field strength $E_p$ [V/m]. Further, in FIG. 13, the solid line represents a result for a case where the inter-electrode distance at the upper end position is longer than the inter-electrode distance at the power feed position, and the dashed line represents a result for a case where the inter-electrode distance at the upper end position and the inter-electrode distance at the power feed position are the same.

As illustrated in FIG. 13, it may be understood that in a case where the inter-electrode distance at the upper end position is longer than the inter-electrode distance at the power feed position, the electric field strength in the plasma generation space decreases, as compared with a case where the inter-electrode distance at the upper end position and the inter-electrode distance at the power feed position are the same. Further, it may be understood that the uniformity of the electric field strength in a product wafer region is improved.

While the first to sixth embodiments have been described, two or more of the first to sixth embodiments may be combined with each other.

In the embodiments described above, a case where the pair of plasma electrodes are arranged on the outer surfaces of the two lateral walls of the plasma partition wall has been described. However, the present disclosure is not limited thereto, and for example, the pair of plasma electrodes may be arranged inside the processing container.

In the embodiments described above, a case where each plasma electrode has a flat plate shape has been described. However, the present disclosure is not limited thereto, and for example, each plasma electrode may have a rod shape.

According to the present disclosure, it is possible to improve the uniformity of the electric field strength along the longitudinal direction of the processing container.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container having a cylindrical shape;
a plasma partition wall configured to cover an opening formed along a longitudinal direction of the processing container;
a pair of plasma electrodes arranged on outer surfaces of both side walls of the plasma partition wall along the longitudinal direction of the processing container while facing each other;
a radio-frequency power supply configured to supply a radio-frequency power to the pair of plasma electrodes; and
a pair of power feed lines configured to connect the pair of plasma electrodes to the radio-frequency power supply, respectively,
wherein an inter-electrode distance at a position distant from a power feed position where the pair of plasma electrodes are connected to the pair of power feed lines, respectively, is longer than an inter-electrode distance at the power feed position when viewed from a front of the plasma partition wall.

2. The plasma processing apparatus according to claim 1, wherein each of the pair of plasma electrodes has a flat plate shape, and a thickness thereof at the position distant from the power feed position is thinner than a thickness thereof at the power feed position when viewed from the front of the plasma partition wall.

3. The plasma processing apparatus according to claim 2, wherein the pair of plasma electrodes each have a flat plate shape and are arranged to be spaced apart from each other as a distance from the power feed position increases when viewed from the front of the plasma partition wall.

4. The plasma processing apparatus according to claim 3, wherein the pair of plasma electrodes each have a rectangular shape including a long side and a short side in a plan view, and
the power feed position is a lateral portion of the short side of the rectangular shape.

5. The plasma processing apparatus according to claim 1, wherein the pair of plasma electrodes are symmetrically arranged with the plasma partition wall interposed therebetween.

6. The plasma processing apparatus according to claim 5, wherein the pair of plasma electrodes are arranged inside the processing container.

7. The plasma processing apparatus according to claim 1, wherein the pair of plasma electrodes each have a flat plate shape and are arranged to be spaced apart from each other as a distance from the power feed position increases when viewed from the front of the plasma partition wall.

8. The plasma processing apparatus according to claim 1, wherein the pair of plasma electrodes each have a rectangular shape including a long side and a short side in a plan view, and
the power feed position is a lateral portion of the short side of the rectangular shape.

9. The plasma processing apparatus according to claim 1, wherein the pair of plasma electrodes are arranged inside the processing container.

* * * * *